(12) United States Patent
Kobayashi et al.

(10) Patent No.: US 10,550,244 B2
(45) Date of Patent: Feb. 4, 2020

(54) RESIN COMPOSITION, PREPREG, METAL FOIL-CLAD LAMINATE, RESIN COMPOSITE SHEET, AND PRINTED WIRING BOARD

(71) Applicant: MITSUBISHI GAS CHEMICAL COMPANY, INC., Tokyo (JP)

(72) Inventors: Takashi Kobayashi, Tokyo (JP); Kentaro Takano, Tokyo (JP); Sotaro Hiramatsu, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 15/521,062

(22) PCT Filed: Nov. 4, 2015

(86) PCT No.: PCT/JP2015/080986
§ 371 (c)(1),
(2) Date: Apr. 21, 2017

(87) PCT Pub. No.: WO2016/072404
PCT Pub. Date: May 12, 2016

(65) Prior Publication Data
US 2017/0313854 A1    Nov. 2, 2017

(30) Foreign Application Priority Data
Nov. 6, 2014  (JP) ................. 2014-226052

(51) Int. Cl.
| | |
|---|---|
| *C08K 5/315* | (2006.01) |
| *C08J 5/24* | (2006.01) |
| *C08K 5/3415* | (2006.01) |
| *C08K 3/36* | (2006.01) |
| *H05K 1/03* | (2006.01) |
| *C08L 79/04* | (2006.01) |
| *C08G 59/40* | (2006.01) |
| *C08L 79/08* | (2006.01) |
| *C08G 73/06* | (2006.01) |
| *C08L 63/00* | (2006.01) |
| *H01L 23/29* | (2006.01) |
| *H05K 3/46* | (2006.01) |

(52) U.S. Cl.
CPC ............. *C08K 5/315* (2013.01); *C08G 59/40* (2013.01); *C08G 73/06* (2013.01); *C08J 5/24* (2013.01); *C08K 3/36* (2013.01); *C08K 5/3415* (2013.01); *C08L 63/00* (2013.01); *C08L 79/04* (2013.01); *C08L 79/085* (2013.01); *H05K 1/0346* (2013.01); *H05K 1/0373* (2013.01); *H01L 23/295* (2013.01); *H05K 3/4652* (2013.01); *H05K 2201/012* (2013.01); *Y10T 428/31515* (2015.04)

(58) Field of Classification Search
CPC . C08G 59/40; C08G 73/06; C08J 5/24; C08L 63/00; C08L 79/04; C08L 79/085; C08K 3/00; C08K 3/36; C08K 5/315; C08K 5/3415; H01L 23/295; H05K 1/03; H05K 1/0346; H05K 1/0373; H05K 2201/012; H05K 3/4652; Y10T 428/31515
See application file for complete search history.

(56) References Cited

U.S. PATENT DOCUMENTS

| | | | |
|---|---|---|---|
| 4,931,545 A | 6/1990 | Shimp et al. | |
| 2005/0182203 A1* | 8/2005 | Sugano ................ | C07C 261/02 525/423 |
| 2014/0227531 A1 | 8/2014 | Ogashiwa et al. | |
| 2015/0299110 A1 | 10/2015 | Katagiri et al. | |

FOREIGN PATENT DOCUMENTS

| | | | | |
|---|---|---|---|---|
| EP | 2 716 709 | | 4/2014 | |
| JP | 6-271669 | | 9/1994 | |
| JP | 11-124433 | | 5/1999 | |
| JP | 3081996 | | 6/2000 | |
| JP | 2000-191776 | | 7/2000 | |
| JP | 2004-269590 | | 9/2004 | |
| JP | 2005264154 A | * | 9/2005 | |
| JP | 2006-169317 | | 6/2006 | |
| JP | 2007-45968 | | 2/2007 | |
| JP | 2008-208201 | | 9/2008 | |
| JP | 2009-001783 | | 1/2009 | |
| JP | 5030297 | | 9/2012 | |
| JP | WO 2015152007 A1 | * | 10/2015 | ............. C08G 61/02 |
| TW | 201309759 | | 3/2013 | |
| WO | 2014065422 A1 | | 5/2014 | |

OTHER PUBLICATIONS

Machine translation of JP 2009001783 (2009).*
Machine translation of WO 2015152007 (2015).*
Priority document Application No. JP 2014-076160 from WIPO. Unpublished. Filing date Apr. 2, 2014. (Year: 2014).*
Machine translation of priority document Application No. JP 2014-076160 from WIPO. Unpublished. Filing date Apr. 2, 2014. (Year: 2014).*
International Search Report issued in Patent Application No. PCT/JP2015/080986, dated Dec. 8, 2015.
International Preliminary Report on Patentability issued in PCT/JP2015/080986, dated May 9, 2017.

* cited by examiner (Continued)

*Primary Examiner* — John D Freeman
(74) *Attorney, Agent, or Firm* — Greenblum & Bernstein, P.L.C.

(57) ABSTRACT

A resin composition comprising one or more cyanate compounds (A) selected from a group consisting of a naphthol aralkyl-based cyanate compound, a naphthylene ether-based cyanate compound, a xylene resin-based cyanate compound, a trisphenolmethane-based cyanate compound, and an adamantane skeleton-based cyanate compound; a polymaleimide compound (B) represented by general formula (1); and a filler (C).

8 Claims, No Drawings

RESIN COMPOSITION, PREPREG, METAL FOIL-CLAD LAMINATE, RESIN COMPOSITE SHEET, AND PRINTED WIRING BOARD

TECHNICAL FIELD

The present invention relates to a resin composition, a prepreg using the resin composition, a metal foil-clad laminate using the prepreg, a resin composite sheet using a resin composition, and a printed wiring board using a resin composition.

BACKGROUND ART

In recent years, higher integration and miniaturization of semiconductors widely used in electronic equipment, communication instruments, personal computers, and the like have accelerated increasingly. With this, various characteristics required of laminates for semiconductor packages used in printed wiring boards have become increasingly strict. Examples of the required characteristics include characteristics such as low water absorbency, moisture absorption heat resistance, flame retardancy, a low dielectric constant, a low dielectric loss tangent, a low thermal expansion coefficient, heat resistance, chemical resistance, and high plating peel strength. But, these required characteristics have not always been satisfied so far.

Conventionally, as resins for printed wiring boards having excellent heat resistance and electrical characteristics, cyanate compounds are known, and a resin composition using a bisphenol A-based cyanate compound and another thermosetting resin and the like is widely used for printed wiring board materials and the like. The bisphenol A-based cyanate compound has characteristics excellent in electrical characteristics, mechanical characteristics, chemical resistance, and the like but may be insufficient in low water absorbency, moisture absorption heat resistance, and flame retardancy, and therefore for the purpose of further improving characteristics, various cyanate compounds having different structures are studied.

For example, as a resin having a structure different from the bisphenol A-based cyanate compound, a novolac-based cyanate compound is often used (for example, see Patent Literature 1), but there are problems such as the novolac-based cyanate compound being likely to be insufficiently cured, and the water absorption rate of the obtained cured product being high and the moisture absorption heat resistance decreasing. As a method for improving these problems, prepolymerization of a novolac-based cyanate compound and a bisphenol A-based cyanate compound is proposed (for example, see Patent Literature 2).

In addition, for improvements in heat resistance, water absorbency, and flame retardancy, a biphenyl aralkyl-based bismaleimide compound is proposed (for example, see Patent Literature 3). Further, as a method for improving flame retardancy, a halogen-based compound being contained in a resin composition by using a fluorinated cyanate compound or mixing or prepolymerizing a cyanate compound and a halogen-based compound is proposed (for example, see Patent Literatures 4 and 5).

CITATION LIST

Patent Literature

Patent Literature 1: Japanese Patent Laid-Open No. 11-124433

Patent Literature 2: Japanese Patent Laid-Open No. 2000-191776

Patent Literature 3: Japanese Patent No. 5030297

Patent Literature 4: Japanese Patent No. 3081996

Patent Literature 5: Japanese Patent Laid-Open No. 6-271669

SUMMARY OF INVENTION

Technical Problem

However, in the method described in Patent Literature 2, the curability is improved by prepolymerization, but characteristics improvements in low water absorbency and moisture absorption heat resistance are still insufficient, and therefore further improvements in low water absorbency and moisture absorption heat resistance are required. In addition, in the method described in Patent Literature 3, characteristics improvements in heat resistance and water absorbency are still insufficient, and therefore further improvements in low water absorbency and moisture absorption heat resistance are required. Further, when a halogen-based compound is used as in Patent Literatures 4 and 5, a harmful substance such as dioxin may be generated during combustion, and therefore it is required to improve flame retardancy without comprising a halogen-based compound. In addition, no literature discloses improving plating peel strength while decreasing moisture absorbency.

The present invention has been made in view of the above problems, and an object of the present invention is to provide a resin composition that can provide a cured product having low water absorbency and high plating peel strength, a prepreg using the resin composition, a metal foil-clad laminate using the prepreg, a resin composite sheet using a resin composition, a printed wiring board using a resin composition, and the like.

Solution to Problem

The present inventors have diligently studied the above problems and, as a result, found that a resin composition containing both a particular cyanate compound and a particular polymaleimide compound can solve the above problems, arriving at the present invention.

Specifically, the present invention is as follows.

[1]

A resin composition comprising:

one or more cyanate compounds (A) selected from a group consisting of a naphthol aralkyl-based cyanate compound, a naphthylene ether-based cyanate compound, a xylene resin-based cyanate compound, trisphenolmethane-based cyanic acid, and an adamantane skeleton-based cyanate compound;

a polymaleimide compound (B) represented by general formula (1); and a filler (C),

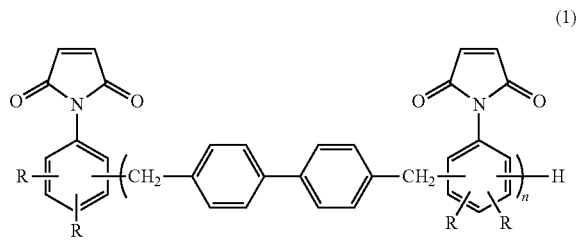

wherein R each independently represents a group selected from a group consisting of a hydrogen atom, an alkyl group having 1 to 5 carbon atoms, and a phenyl group, and n is an average value and represents $1<n\leq5$.

[2]

The resin composition according to [1], wherein a content of the polymaleimide compound (B) is 1 to 90 parts by mass based on 100 parts by mass of resin solids in the resin composition.

[3]

The resin composition according to [1] or [2], further comprising one or more selected from a group consisting of an epoxy resin (D), a phenolic resin (E), and a maleimide compound (F) other than the polymaleimide compound (B) represented by general formula (1).

[4]

The resin composition according to any one of [1] to [3], wherein a content of the filler (C) is 50 to 1600 parts by mass based on 100 parts by mass of the resin solids in the resin composition.

[5]

A prepreg comprising:

a base material; and the resin composition according to any one of [1] to [4] with which the base material is impregnated or coated.

[6]

A metal foil-clad laminate comprising:

at least one or more of the prepregs according to [5] laminated; and metal foil disposed on one surface or both surfaces of the prepreg.

[7]

A resin composite sheet comprising:

a support; and the resin composition according to any one of [1] to [4] disposed on a surface of the support.

[8]

A printed wiring board comprising:

an insulating layer; and a conductor layer formed on a surface of the insulating layer, wherein the insulating layer comprises the resin composition according to any one of [1] to [4].

Advantageous Effect of Invention

According to the present invention, a resin composition that is made in view of the above problems and can provide a cured product having low water absorbency and high plating peel strength, a prepreg using the resin composition, a metal foil-clad laminate using the prepreg, a resin composite sheet using a resin composition, a printed wiring board using a resin composition can be provided.

In addition, according to a preferred aspect of the present invention, a resin composition comprising only non-halogen-based compounds (in other words, a resin composition comprising no halogen-based compound or a non-halogen-based resin composition), a prepreg, a resin composite sheet, a metal foil-clad laminate, a printed wiring board, and the like can also be realized, and their industrial practicality is extremely high.

DESCRIPTION OF EMBODIMENT

A mode for carrying out the present invention (hereinafter referred to as "this embodiment") will be described in detail below. The following embodiment is an illustration for explaining the present invention, and the present invention is not limited only to the embodiment.

[Resin Composition]

A resin composition in this embodiment comprises one or more cyanate compounds (A) selected from the group consisting of a naphthol aralkyl-based cyanate compound, a naphthylene ether-based cyanate compound, a xylene resin-based cyanate compound, a trisphenolmethane-based cyanate compound, and an adamantane skeleton-based cyanate compound; a polymaleimide compound (B) represented by general formula (1); and a filler (C).

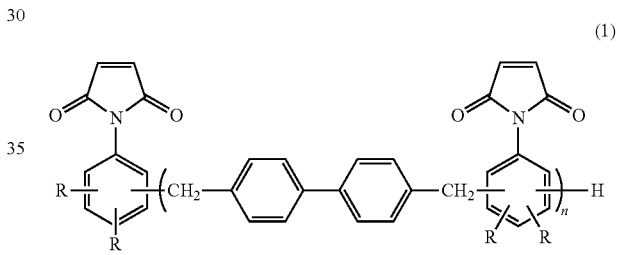

wherein R each independently represents a group selected from the group consisting of a hydrogen atom, an alkyl group having 1 to 5 carbon atoms, and a phenyl group, and n is an average value and represents $1<n\leq5$.

[Cyanate Compound (A)]

The cyanate compound (A) is any one or more selected from the group consisting of a naphthol aralkyl-based cyanate compound, a naphthylene ether-based cyanate compound, a xylene resin-based cyanate compound, a trisphenolmethane-based cyanate compound, and an adamantane skeleton-based cyanate compound. Among these, any one or more selected from the group consisting of a naphthol aralkyl-based cyanate compound, a naphthylene ether-based cyanate compound, and a xylene resin-based cyanate compound are preferred, and a naphthol aralkyl-based cyanate compound is particularly preferred. By using such a cyanate compound, the plating adhesiveness of the obtained cured product improves more, and the water absorbency decreases more. These cyanate compounds can be obtained by known methods, and commercial products can also be used. In a cyanate compound having a naphthol aralkyl skeleton, a naphthylene ether skeleton, a xylene skeleton, a trisphenolmethane skeleton, or an adamantane skeleton, the functional group equivalent number is relatively large, and the number of unreacted cyanate groups tends to decrease, and therefore the water absorbency decreases more. In addition, when the cyanate compound has an aromatic skeleton or an adamantane skeleton, the plating adhesiveness improves more. However, the action mechanisms of improvements in the effects of the structure of the cyanate compound (A) are not limited to the above.

The weight average molecular weight Mw of the cyanate compound (A) is not particularly limited but is preferably 200 to 5000, more preferably 300 to 3000, and further preferably 300 to 2000. When the weight average molecular weight Mw of the cyanate compound (A) is in the above range, the moldability of the resin composition tends to improve more, and the poor appearance of the obtained cured product tends to be more improved.

The content of the cyanate compound (A) can be appropriately set according to the desired characteristics and is not particularly limited but is preferably 10 to 99 parts by mass, more preferably 15 to 90 parts by mass, further preferably 20 to 75 parts by mass, and still further preferably 25 to 60 parts by mass based on 100 parts by mass of resin solids in the resin composition. When the content of the cyanate compound (A) is in the above range, the plating adhesiveness of the obtained cured product tends to improve more, and the water absorbency tends to decrease more. Here, the "resin solids in the resin composition" refers to components in the resin composition excluding a solvent and the filler (C) unless otherwise noted, and "100 parts by mass of resin solids" refers to the total of the components in the resin composition excluding the solvent and the filler being 100 parts by mass.

[Polymaleimide Compound (B)]

The polymaleimide compound (B) is represented by the following general formula (1). By using the polymaleimide compound having such a structure, the plating adhesion strength of the obtained cured product improves more.

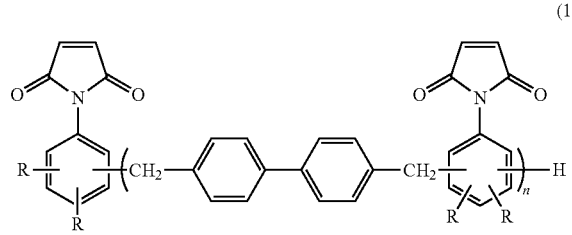

(1)

wherein R each independently represents a group selected from the group consisting of a hydrogen atom, an alkyl group having 1 to 5 carbon atoms, and a phenyl group, and n is an average value and represents 1<n≤5.

The plurality of R present in formula (1) each independently represent a group selected from the group consisting of a hydrogen atom, an alkyl group having 1 to 5 carbon atoms, and a phenyl group. Among these, a hydrogen atom, a methyl group, or a phenyl group is preferred. When the polymaleimide compound (B) has such a group, the flame retardancy and plating adhesion strength of the obtained cured product tend to improve more. In addition, n is an average value and represents 1<n≤5. When n is 5 or less, the solvent solubility is good. Such a polymaleimide compound (B) is not particularly limited. Examples thereof include MIR-3000 manufactured by Nippon Kayaku Co., Ltd.

The content of the polymaleimide compound (B) can be appropriately set according to the desired characteristics and is not particularly limited but is preferably 1 to 90 parts by mass, more preferably 15 to 90 parts by mass, further preferably 25 to 75 parts by mass, and still further preferably 40 to 60 parts by mass based on 100 parts by mass of the resin solids in the resin composition. When the content of the polymaleimide compound (B) is in the above range, the flexibility and plating adhesion strength of the obtained cured product tend to improve more.

The ratio of the maleimide group equivalent of the polymaleimide compound (B) to the cyanate group equivalent of the cyanate compound (A) is preferably in the range of 0.1 to 9.0, more preferably in the range of 0.4 to 3.0, and further preferably in the range of 0.7 to 2.5. When the ratio of the maleimide group equivalent of the polymaleimide compound (B) to the cyanate group equivalent of the cyanate compound (A) is in the above range, the water absorbency of the obtained cured product tends to decrease more, and the plating peel strength tends to improve more.

[Filler (C)]

As the filler (C), known ones can be appropriately used, and the type of the filler (D) is not particularly limited. Inorganic fillers and organic fillers generally used in the industry can be preferably used. The inorganic fillers are not particularly limited. Examples thereof include silicas such as natural silica, fused silica, synthetic silica, amorphous silica, AEROSIL, hollow silica, and white carbon; oxides such as titanium white, zinc oxide, magnesium oxide, zirconium oxide, and alumina; nitrides such as boron nitride, aggregated boron nitride, silicon nitride, and aluminum nitride; a sulfate such as barium sulfate; metal hydrates such as aluminum hydroxide, heat-treated products of aluminum hydroxide (products obtained by heat-treating aluminum hydroxide to decrease some of the water of crystallization), boehmite, and magnesium hydroxide; molybdenum compounds such as molybdenum oxide and zinc molybdate; zincs such as zinc borate and zinc stannate; and such as clay, kaolin, talc, calcined clay, calcined kaolin, calcined talc, mica; E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass.

The organic fillers are not particularly limited. Examples thereof include rubber powders such as styrene-based rubber powders, butadiene-based rubber powders, and acrylic rubber powders, core-shell-based rubber powders, silicone resin powders, silicone rubber powders, and silicone composite powders. One of these fillers can be used alone, or two or more of these fillers can be used in combination. Among these, inorganic fillers are preferred, and silicas are more preferred.

The content of the filler (C) can be appropriately set according to the desired characteristics and is not particularly limited but is preferably 50 to 1600 parts by mass, more preferably 75 to 1200 parts by mass, further preferably 75 to 1000 parts by mass, still further preferably 75 to 750 parts by mass, still more preferably 75 to 500 parts by mass, and particularly preferably 75 to 150 parts by mass based on 100 parts by mass of the resin solids in the resin composition. When the content of the filler (C) is in the above range, the moldability of the resin composition tends to improve more.

Here, when the filler (C) is used, a silane coupling agent and a wetting and dispersing agent are preferably used in combination. As the silane coupling agent, those generally used for surface treatment of inorganic matter can be preferably used, and the type of the silane coupling agent is not particularly limited. Specific examples include aminosilane-based compounds such as γ-aminopropyltriethoxysilane and N-β-(aminoethyl)-γ-aminopropyltrimethoxysilane; epoxysilane-based compounds such as γ-glycidoxypropyltrimethoxysilane and β-(3,4-epoxycyclohexyl)ethyltrimethoxysilane;

vinylsilane-based compounds such as γ-methacryloxypropyltrimethoxysilane and vinyl-tri(β-methoxyethoxy)silane; cationic silane-based compounds such as N-β-(N-vinylbenzylaminoethyl)-γ-aminopropyltrimethoxysilane hydrochloride; and phenylsilane-based compounds. One of these silane coupling agent can be used alone, or two or more of these silane coupling agents can be used in combination.

In addition, as the wetting and dispersing agent, those generally used for paints can be preferably used, and the type of the wetting and dispersing agent is not particularly limited. Preferably, copolymer-based wetting and dispersing agents are used. Specific examples thereof include Disperbyk-110, 111, 161, and 180, BYK-W996, BYK-W9010, BYK-W903, and BYK-W940 manufactured by BYK Japan KK. One of these wetting and dispersing agent can be used alone, or two or more of these wetting and dispersing agents can be used in combination.

[Other Components]

Further, the resin composition in this embodiment may contain an epoxy resin (D), a phenolic resin (E), a maleimide compound (F) other than the polymaleimide compound (B) represented by general formula (1), an oxetane resin (G), a benzoxazine compound (H), a compound (I) having a polymerizable unsaturated group, and the like, as needed. Particularly, the resin composition in this embodiment preferably further contains one or more selected from the group consisting of the epoxy resin (D), the phenolic resin (E), and the maleimide compound (F) other than the above polymaleimide compound (B) represented by general formula (1).

[Epoxy Resin (D)]

As the epoxy resin (D), known ones can be appropriately used as long as they are epoxy resins having two or more epoxy groups in one molecule. The type of the epoxy resin is not particularly limited. Specific examples include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these epoxy resins (D), biphenyl aralkyl-based epoxy resins, naphthylene ether-based epoxy resins, polyfunctional phenol-based epoxy resins, and naphthalene-based epoxy resins are preferred in terms of flame retardancy and heat resistance. One of these epoxy resins (D) can be used alone, or two or more of these epoxy resins can be used in combination.

[Phenolic Resin (E)]

As the phenolic resin (E), those generally known can be used as long as they are phenolic resins having two or more hydroxyl groups in one molecule. Examples of the phenolic resin (E) include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins but are not particularly limited. Among these phenolic resins (E), biphenyl aralkyl-based phenolic resins, naphthol aralkyl-based phenolic resins, phosphorus-containing phenolic resins, and hydroxyl group-containing silicone resins are preferred in terms of flame retardancy. One of these phenolic resins (E) can be used alone, or two or more of these phenolic resins can be used in combination.

[Maleimide Compound (F)]

As the maleimide compound (F) other than the polymaleimide compound (B) represented by general formula (1), those generally known can be used as long as they are those that are compounds having one or more maleimide groups in one molecule and other than the polymaleimide compound (B) represented by general formula (1). Examples of the maleimide compound (F) include 4,4-diphenylmethanebismaleimide, phenylmethanemaleimide, m-phenylenebismaleimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy) benzene, polyphenylmethanemaleimide, and prepolymers of these maleimide compounds, and prepolymers of maleimide compounds and amine compounds but are not particularly limited. One of these maleimide compounds (F) can be used, or two or more of these maleimide compounds (F) can be mixed and used.

[Oxetane Resin (G)]

As the oxetane resin (G), those generally known can be used. Examples of the oxetane resin (G) include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl) oxetane, biphenyl-based oxetane, OXT-101 (trade name manufactured by Toagosei Co., Ltd.), and OXT-121 (trade name manufactured by Toagosei Co., Ltd.) and are not particularly limited. One of these oxetane resins (G) can be used alone, or two or more of these oxetane resins can be mixed and used.

[Benzoxazine Compound (H)]

As the benzoxazine compound (H), those generally known can be used as long as they are compounds having two or more dihydrobenzoxazine rings in one molecule. Examples of the benzoxazine compound (H) include bisphenol A-based benzoxazine BA-BXZ (trade name, manufactured by Konishi Chemical Ind. Co., Ltd.) bisphenol F-based benzoxazine BF-BXZ (trade name, manufactured by Konishi Chemical Ind. Co., Ltd.), and bisphenol S-based benzoxazine BS-BXZ (trade name, manufactured by Konishi Chemical Ind. Co., Ltd.) and are not particularly limited. One of these benzoxazine compounds (H) can be used alone, or two or more of these benzoxazine compounds can be mixed and used.

[Compound (I) Having a Polymerizable Unsaturated Group]

As the compound (I) having a polymerizable unsaturated group, those generally known can be used. Examples of the compound (I) having a polymerizable unsaturated group include vinyl compounds such as ethylene, propylene, styrene, divinylbenzene, and divinylbiphenyl, (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate, epoxy (meth)acrylates such as bisphenol A-based epoxy (meth)acrylate and bisphenol F-based epoxy (meth)acrylate, benzocyclobutene resins, and (bis)maleimide resins and are not particularly limited. One of these compounds (I) having an unsaturated group can be used alone, or two or more of these compounds having an unsaturated group can be mixed and used.

[Curing Accelerator]

In addition, the resin composition in this embodiment may contain a curing accelerator for appropriately adjusting the curing rate, as needed. As this curing accelerator, those generally used as curing accelerators for cyanate compounds, epoxy resins, and the like can be preferably used, and the type of the curing accelerator is not particularly limited. Specific examples thereof include organometallic salts such as zinc octylate, zinc naphthenate, cobalt naphthenate, copper naphthenate, acetylacetone iron, nickel octylate, and manganese octylate; phenol compounds such as phenol, xylenol, cresol, resorcin, catechol, octyl phenol, and nonyl phenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole; and 2-phenyl-4-methyl-5-hydroxymethylimidazole; and derivatives such as adducts of carboxylic acids of these imidazoles or acid anhydrides thereof; amines such as dicyandiamide, benzyldimethylamine, and 4-methyl-N,N-dimethylbenzylamine; phosphorus compounds such as phosphine-based compounds, phosphine oxide-based compounds, phosphonium salt-based compounds, and diphosphine-based compounds; epoxy-imidazole adduct-based compounds; peroxides such as benzoyl peroxide, p-chlorobenzoyl peroxide, di-t-butyl peroxide, diisopropyl peroxycarbonate, and di-2-ethylhexyl peroxycarbonate; or azo compounds such as azobisisobutyronitrile. One of these curing accelerator can be used alone, or two or more of these curing accelerators can be used in combination.

The amount of the curing accelerator used can be appropriately adjusted considering the degrees of cure of the resins, the viscosity of the resin composition, and the like and is not particularly limited but is usually 0.005 to 10 parts by mass based on 100 parts by mass of the resin solids in the resin composition.

Further, various polymer compounds such as another thermosetting resin, a thermoplastic resin and an oligomer thereof, and an elastomer, a flame-retardant compound, various additives, and the like can be used in combination in the resin composition in this embodiment as needed. These are not particularly limited as long as they are those generally used. Examples of the flame-retardant compound include bromine compounds such as 4,4'-dibromobiphenyl, phosphates, melamine phosphate, phosphorus-containing epoxy resins, nitrogen compounds such as melamine and benzoguanamine, oxazine ring-containing compounds, and silicone-based compounds. In addition, examples of the various additives include ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these can be used alone or two or more of these can be used in combination as desired.

[Organic Solvent]

An organic solvent can be used in the resin composition in this embodiment as needed. In this case, the resin composition in this embodiment can be used as a form (solution or varnish) in which at least some, preferably all, of the above-described various resin components are dissolved in or compatible with the organic solvent. As the organic solvent, known ones can be appropriately used as long as they can dissolve or be compatible with at least some, preferably all, of the above-described various resin components. The type of the organic solvent is not particularly limited. Specific examples include polar solvents such as ketones such as acetone, methyl ethyl ketone, and methyl isobutyl ketone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, methyl methoxypropionate, and methyl hydroxyisobutyrate and amides such as dimethylacetamide and dimethylformamide; and nonpolar solvents such as aromatic hydrocarbons such as toluene and xylene. One of these can be used alone, or two or more of these can be used in combination.

[Applications]

The resin composition in this embodiment can be used as an insulating layer of a printed wiring board and a semiconductor package material. For example, the resin composition in this embodiment can be used as materials constituting a prepreg, a metal foil-clad laminate using the prepreg, a resin composite sheet, and a printed wiring board. These will be described below.

(Prepreg)

A prepreg in this embodiment comprises a base material; and the above resin composition with which the base material is impregnated or coated. The method for producing the prepreg is not particularly limited as long as it is a method of combining the resin composition in this embodiment and a base material to produce a prepreg. Specifically, the prepreg in this embodiment can be produced by impregnating or coating a base material with the resin composition in this embodiment and then semi-curing the resin composition by a method of drying at 120 to 220° C. for about 2 to 15 minutes, or the like. At this time, the amount of the resin composition adhered to the base material, that is, the amount of the resin composition (including the filler (C)) based on the total amount of the prepreg after the semi-curing, is preferably in the range of 20 to 99% by mass.

As the base material used when the prepreg in this embodiment is produced, known ones used for various printed wiring board materials can be used. Examples of the base material include, but are not particularly limited to, woven fabrics of fibers of glass such as E glass, D glass, L glass, S glass, T glass, Q glass, UN glass, NE glass, and spherical glass; inorganic fibers of materials other than glass, such as quartz; organic fibers of polyimides, polyamides, polyesters, and the like; liquid crystal polyesters; and the like. As the shape of the base material, woven fabrics, nonwoven fabrics, rovings, chopped strand mats, surfacing mats, and the like are known, and the shape of the base material may be any. One of these base materials can be used alone, or two or more of these base materials can be used in combination. In addition, the thickness of the base material is not particularly limited, but is preferably in the range of 0.01 to 0.2 mm in laminate applications. Particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, and the like are preferred from the viewpoint of moisture absorption heat resistance. In addition, liquid crystal polyester woven fabrics are preferred in terms of electrical characteristics.

(Metal Foil-Clad Laminate)

In addition, a metal foil-clad laminate in this embodiment comprises at least one or more of the above prepregs laminated; and metal foil disposed on one surface or both surfaces of the prepreg. The method for producing the metal foil-clad laminate is not particularly limited. Examples thereof include a method of stacking at least one or more of the above-described prepregs, disposing metal foil on one surface or both surfaces of the stack, and laminate-molding the metal foil and the stack. Specifically, the metal foil-clad laminate can be fabricated by stacking one or a plurality of the above-described prepregs, disposing foil of a metal such as copper or aluminum on one surface or both surfaces of the stack, and laminate-molding the metal foil and the stack. The metal foil used here is not particularly limited as long as it is one used for a printed wiring board material. Copper foil such as rolled copper foil and electrolytic copper foil is preferred. In addition, the thickness of the metal foil is not particularly limited but is preferably 2 to 70 μm, more preferably 3 to 35 μm. As the molding conditions, usual methods for laminates and multilayer boards for printed wiring boards can be applied. For example, the metal foil-clad laminate of the present invention can be produced by laminate-molding with a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be provided by laminate-molding the above prepreg and a separately fabricated wiring board for an inner layer in combination. As the method for producing a multilayer board, for example, a multilayer board can be fabricated by disposing 35 μm copper foil on both surfaces of one of the above-described prepreg, laminating and forming the copper foil and the prepreg under the above conditions, then forming inner layer circuits, subjecting these circuits to blackening treatment to form an inner layer circuit board, then alternately disposing these inner layer circuit boards and the above prepregs one by one, further disposing copper foil on the outermost layers, and laminate-molding the copper foil, the inner layer circuit boards, and the prepregs under the above conditions preferably under vacuum. The metal foil-clad laminate in this embodiment can be preferably used as a printed wiring board.

(Printed Wiring Board)

A printed wiring board in this embodiment comprises an insulating layer; and a conductor layer formed on a surface of the insulating layer, and the insulating layer comprises the above resin composition. Such a printed wiring board can be produced according to an ordinary method, and the method for producing the printed wiring board is not particularly limited. One example of a method for producing a printed wiring board will be shown below. First, a metal foil-clad laminate such as the above-described copper-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed. Then, the required number of the above-described prepregs are stacked on the inner layer circuit surfaces, metal foil for outer layer circuits is further laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

The printed wiring board obtained in the above production example has a configuration in which it has insulating layers and conductor layers formed on surfaces of these insulating layers, and the insulating layers comprise the resin composition in this embodiment described above. In other words, the prepreg in this embodiment described above (the base material and the resin composition in this embodiment with which the base material is impregnated or coated) and the resin composition layer of the metal foil-clad laminate in this embodiment described above (the layer comprising the resin composition of the present invention) are composed of an insulating layer comprising the resin composition in this embodiment.

(Resin Composite Sheet)

On the other hand, a resin composite sheet in this embodiment comprises a support; and the above resin composition disposed on a surface of the support. The resin composite sheet can be used as a buildup film or a dry film solder resist. The method for producing the resin composite sheet is not particularly limited. Examples thereof include a method of coating a support with a solution of the above resin composition in this embodiment dissolved in a solvent and drying the solution to obtain a resin composite sheet.

Examples of the support used here include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped supports such as glass plates, SUS plates, and FRP but are not particularly limited.

Examples of the coating method include a method of coating a support with a solution of the resin composition in this embodiment dissolved in a solvent by a bar coater, a die coater, a doctor blade, a baker applicator, or the like. In addition, a single-layer sheet (resin sheet) can also be provided by peeling or etching the support from the resin composite sheet in which the support and the resin composition are laminated, after drying. A single-layer sheet (resin sheet) can also be obtained without using a support by supplying a solution of the above resin composition in this embodiment dissolved in a solvent into a mold having a sheet-shaped cavity, and drying the solution, or the like for molding into a sheet shape.

In fabrication of the single-layer sheet or the resin composite sheet in this embodiment, the drying conditions when the solvent is removed are not particularly limited but are preferably a temperature of 20° C. to 200° C. for 1 to 90 minutes because at low temperature, the solvent is likely to remain in the resin composition, and at high temperature, curing of the resin composition proceeds. In addition, in the single-layer sheet or resin composite sheet, the resin composition can also be used in an uncured state in which the solvent is only dried, or in a semi-cured (B-staged) state as needed. Further, the thickness of the resin layer of the single-layer or resin composite sheet in this embodiment can be adjusted by the concentration and coating thickness of the solution of the resin composition in this embodiment and is not particularly limited but is preferably 0.1 to 500 μm because generally, when the coating thickness increases, the solvent is likely to remain during drying.

EXAMPLES

The present invention will be described in more detail below by showing Synthesis Examples, an Example, and a Comparative Example, but the present invention is not limited to these.

(Synthesis Example 1) Synthesis of Cyanate Compound 300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution 1.

125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were mixed. While the obtained mixed liquid was kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 cm$^{-1}$ (cyanate groups) and showed no absorption of hydroxy groups.

Example 1

50 parts by mass of the SNCN obtained by Synthesis Example 1, 50 parts by mass of a biphenyl aralkyl-based polymaleimide compound represented by formula (2) (MIR-3000, manufactured by Nippon Kayaku Co., Ltd.), 100 parts by mass of fused silica (SC2050 MB, manufactured by Admatechs Company Limited), and 0.05 parts by mass of zinc octylate (manufactured by Nihon Kagaku Sangyo Co., Ltd.) were mixed to obtain a varnish. This varnish was diluted with methyl ethyl ketone, and an E-glass woven fabric having a thickness of 0.1 mm was impregnated and coated with the diluted varnish and heated and dried at 150° C. for 5 minutes to obtain a prepreg having a resin content of 50% by mass. The cyanate group equivalent of the cyanate compound (A) was 256 g/eq, the maleimide group equivalent of the polymaleimide compound (B) was 275 g/eq, and the ratio of the maleimide group equivalent of the polymaleimide compound (B) to the cyanate group equivalent of the cyanate compound (A) was 1.07.

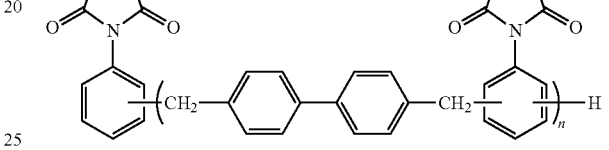

(2)

wherein n is an average value and represents 1.4.

Eight of the obtained prepregs were stacked, and 12 μm thick electrolytic copper foil (3EC-M3-VLP, manufactured by MITSUI MINING & SMELTING CO., LTD.) was disposed on the top and the bottom. The stack was laminate-molded at a pressure of 30 kgf/cm$^2$ and a temperature of 220° C. for 120 minutes to obtain a metal foil-clad laminate having an insulating layer thickness of 0.8 mm. Evaluation of water absorption rate and plating peel strength was performed using the obtained metal foil-clad laminate. The results are shown in Table 1.

Comparative Example 1

A metal foil-clad laminate having a thickness of 0.8 mm was obtained as in Example 1 except that instead of using 50 parts by mass of the naphthol aralkyl-based cyanate compound, 50 parts by mass of a bisphenol A-based cyanate compound (CA210, manufactured by MITSUBISHI GAS CHEMICAL COMPANY, INC.) and 0.03 parts by mass of zinc octylate were used in Example 1. The evaluation results of the obtained metal foil-clad laminate are shown in Table 1.

Comparative Example 2

A metal foil-clad laminate having a thickness of 0.8 mm was obtained as in Example 1 except that instead of using 50 parts by mass of the biphenyl aralkyl-based polymaleimide compound represented by formula (2), 50 parts by mass of a phenol novolac-based maleimide compound (BMI-2300, manufactured by Daiwa Fine Chemicals Co., Ltd.) and 0.03 parts by mass of zinc octylate were used in Example 1. The evaluation results of the obtained metal foil-clad laminate are shown in Table 1.

Comparative Example 3

A metal foil-clad laminate having a thickness of 0.8 mm was obtained as in Example 1 except that instead of using 50 parts by mass of the biphenyl aralkyl-based polymaleimide compound represented by formula (2), 50 parts by mass of bis(3-ethyl-5-methyl-4-maleimidophenyl)methane (BMI-70, manufactured by K.I Chemical Industry Co., Ltd.) and 0.03 parts by mass of zinc octylate were used in Example 1. The evaluation results of the obtained metal foil-clad laminate are shown in Table 1.

(Measurement Methods and Evaluation Methods)
1) Water Absorption Rate:

The water absorption rate after treatment at 121° C. and 2 atmospheres by a pressure cooker tester (manufactured by HIRAYAMA MANUFACTURING CORPORATION, model PC-3) for 5 hours was measured in accordance with SIS C648 using a sample obtained by cutting each of the metal foil-clad laminates obtained in Example 1 and Comparative Examples 1 to 3 to 30 mm×30 mm.

2) Plating Peel Strength:

For each of the metal foil-clad laminates obtained in Example 1 and Comparative Examples 1 to 3, electroless copper plating of about 0.8 μm was provided by the process of electroless copper plating manufactured by C. Uyemura & Co., Ltd. (names of chemical solutions used: MCD-PL, MDP-2, MAT-SP, MAB-4-C, MEL-3-APEA ver. 2), and drying was performed at 130° C. for 1 hour. Next, electrolytic copper plating was provided so that the thickness of plating copper was 18 μm, and drying was performed at 180° C. for 1 hour. In this manner, a sample in which a conductor layer (plating copper) having a thickness of 18 μm was formed on an insulating layer was fabricated and evaluated. Using the obtained sample, the adhesive force of the plating copper (plating peel strength) was measured three times in accordance with JIS C6481, and the average value was obtained.

TABLE 1

|  |  | Example 1 | Comparative Example 1 | Comparative Example 2 | Comparative Example 3 |
|---|---|---|---|---|---|
| Water absorption rate (%) | After treatment for 5 hours | 0.35 | 0.54 | 0.46 | 0.39 |
| Plating peel strength kN/m | | 0.37 | 0.23 | 0.16 | Blisters |

As is clear from Table 1, it was confirmed that by using the resin composition of the present invention, a prepreg, a printed wiring board, and the like not only having low water absorbency but also having excellent plating peel strength were realized.

This application is based on Japanese Patent Application No. 2014-226052 filed with the Japan Patent Office on Nov. 6, 2014, the contents of which are incorporated herein by reference.

INDUSTRIAL APPLICABILITY

As described above, the resin composition of the present invention can be widely and effectively used in various applications such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively used as printed wiring board materials adapted to higher integration and higher density for information terminal equipment, communication equipment, and the like in recent years. In addition, the laminate, metal foil-clad laminate, and the like of the present invention not only have low water absorbency but have performance also excellent in plating peel strength, and therefore their industrial practicality is extremely high.

The invention claimed is:
1. A resin composition comprising:
a naphthol aralkyl-based cyanate compound (A);
a polymaleimide compound (B) represented by general formula (1); and
a filler (C),

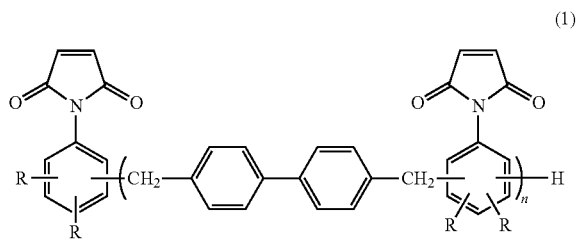

(1)

wherein R each independently represents a group selected from a group consisting of a hydrogen atom, an alkyl group having 1 to 5 carbon atoms, and a phenyl group, and n is an average value and represents $1<n\leq5$,
wherein the ratio of the maleimide group equivalent of the polymaleimide compound (B) to the cyanate group equivalent of the cyanate compound (A) is in the range of 0.1 to 3.0, and
wherein the filler (C) comprises silica.

2. The resin composition according to claim 1, wherein a content of the polymaleimide compound (B) is 1 to 90 parts by mass based on 100 parts by mass of resin solids in the resin composition.

3. The resin composition according to claim 1, further comprising one or more selected from the group consisting of an epoxy resin (D), a phenolic resin (E), and a maleimide compound (F) other than the polymaleimide compound (B) represented by general formula (1).

4. The resin composition according to claim 1, wherein a content of the filler (C) is 50 to 1600 parts by mass based on 100 parts by mass of the resin solids in the resin composition.

5. A prepreg comprising:
a substrate; and
the resin composition according to claim 1 with which the substrate is impregnated or coated.

6. A metal foil-clad laminate comprising:
at least one prepreg according to claim 5; and
having metal foil disposed on one surface or both surfaces of the at least one prepreg.

7. A resin composite sheet comprising:
a support; and
the resin composition according to claim 1 disposed on a surface of the support.

8. A printed wiring board comprising:
an insulating layer; and a conductor layer formed on a surface of the insulating layer, wherein
the insulating layer comprises the resin composition according to claim 1.

* * * * *